(12) United States Patent
Onimoto et al.

(10) Patent No.: US 6,232,724 B1
(45) Date of Patent: May 15, 2001

(54) LIGHT EMITTING DIODE ARRAY

(75) Inventors: Takashi Onimoto; Hideo Tanaka, both of Ibaraki; Tamotsu Nishiura, Kanagawa, all of (JP)

(73) Assignees: Fujitsu Limited, Kanagawa-Ken; Hitachi Cable Ltd., Tokyo, both of (JP)

( * ) Notice: Subject to any disclaimer, the term of this patent is extended or adjusted under 35 U.S.C. 154(b) by 0 days.

(21) Appl. No.: 09/219,304

(22) Filed: Dec. 23, 1998

(30) Foreign Application Priority Data

Dec. 25, 1997 (JP) .................................................. 9-357961

(51) Int. Cl.$^7$ .................................................. H05B 37/00
(52) U.S. Cl. ..................... 315/161; 315/227 R; 315/228; 363/89
(58) Field of Search ................................ 315/209 R, 291, 315/219, 161, 227 R, 228; 363/89

(56) References Cited

U.S. PATENT DOCUMENTS

| | | | |
|---|---|---|---|
| 3,914,679 | * 10/1975 | Sullivan | 321/2 |
| 4,329,625 | * 5/1982 | Nishizawa et al. | 315/158 |
| 4,717,868 | * 1/1988 | Peterson | 323/288 |
| 5,135,160 | * 8/1992 | Tasaki | 235/462 |
| 5,343,122 | * 8/1994 | Sugimori et al. | 315/209 R |
| 5,446,440 | * 8/1995 | Gleason et al. | 340/331 |
| 5,661,645 | * 8/1997 | Hochstein | 363/89 |

\* cited by examiner

Primary Examiner—David Vu
(74) Attorney, Agent, or Firm—Carter, Ledyard & Milburn

(57) ABSTRACT

An LED array composed of a plurality of LEDs is disposed on either side of a signal interconnection board, while metal plates are disposed on the other side of the signal interconnection board as positive and negative power source lines for driving the LEDs, respectively, and a capacitor is provided between the positive metal plate for power supply and the negative metal plate for power supply. As a result, the LED array in which an output light is not lowered in power, no variations in light output arises in every LEDs, and all the LEDs can be turned on simultaneously is provided.

4 Claims, 5 Drawing Sheets

LIGHT EMITTING DIODE ARRAY

FIELD OF THE INVENTION

The present invention relates to a light emitting diode (hereinafter referred to simply as "LED") array, and more particularly to an LED array in which an output light is not lowered in power, the uniformity of output light of each LED is improved, and all of the LEDs are turned on simultaneously.

BACKGROUND OF THE INVENTION

A conventional LED array is shown in FIGS. 1 and 2 wherein an LED chip 1 is mounted on either side (the top surface in this case) of a signal interconnection board 2, while (positive-) and (negative-) N-patterned power supply lines 11 and 12 for driving the LED chip (LED chips) are provided on the other side (the bottom surface in this case) of the signal interconnection board 2 to constitute the LED array. As the LED chip 1, either the one which has been prepared from a plurality of LEDs into a single chip, or a plurality of chips each of which has been prepared in the form of a single LED may be applied. In either case, an LED array is constituted on the top surface of the signal interconnection board 2. The patterned power supply lines 11 and 12 are prepared by a printed wiring operation wherein the P-patterned power supply line 11 and the N-patterned power supply line 12 are provided by a printed wiring manner, respectively. These patterned power supply lines 11 and 12 are connected to an external power supply through an interconnecting means.

It is to be noted that there has heretofore been no such LED array wherein a capacitor is provided between positive and negative power supply lines.

Meanwhile, power supply voltage for driving LED is applied between positive and negative power supply lines. In this case, voltage drop occurs due to rush current at a moment when the LED is turned on. For this reason when all the LEDs are turned on at the same time, lowering of light output and variations in light output among the respective LEDs arise. In order to prevent occurrences of such lowering of light output and such variations in light output, LEDs have been divided into a plurality of groups, and they have been sequentially turned on while accomplishing time shifts in every groups. Because of such sequential turn-on for LEDs, it was difficult to establish prompt operation for selecting turn-on or turn-off action for LED arrays.

Furthermore, since power supply lines are ones which have been patterned on a signal interconnection board, large amounts of current cannot be applied. Hence, current to be applied to respective LEDs are also restricted, so that high light output cannot be obtained.

SUMMARY OF THE INVENTION

Accordingly, an object of the present invention is to provide an LED array wherein an output light is not lowered in power, no variations in output light appear in every LEDs, and all the LEDs can be turned on simultaneously. According to the invention, an LED array, comprises: a signal interconnection board having signal interconnections; a plurality of LEDs each connected to corresponding terminals of the signal interconnections of the signal interconnection board, the plurality of LEDs being arranged in array on a first plane of the signal interconnection boards; positive and negative power supply metal plates connected to a power supply at first ends thereof and to the signal interconnections of the signal interconnection board at a second ends thereof, the positive and negative power supply metal plates being arranged on a second plane of the signal interconnection board; and at least one capacitor provided between the positive and negative power supply metal plates.

The above described capacitor may have a capacitance C meeting the equation:

$$C \geq (K+I)(VO \times t)$$

where VO is a power supply voltage for driving the plurality of LEDs at an ordinary state, I is a total current at the time of turning the plurality of LEDs on, t is a period of time in which a voltage lowered instantly at a time of turning the plurality of LED on is restored to be the voltage VO, and K is a constant.

BRIEF DESCRIPTION OF THE DRAWINGS

The present invention will be explained in more detail in conjunction with appended drawings, wherein.

DESCRIPTION OF THE PREFERRED EMBODIMENT

Figure 1:
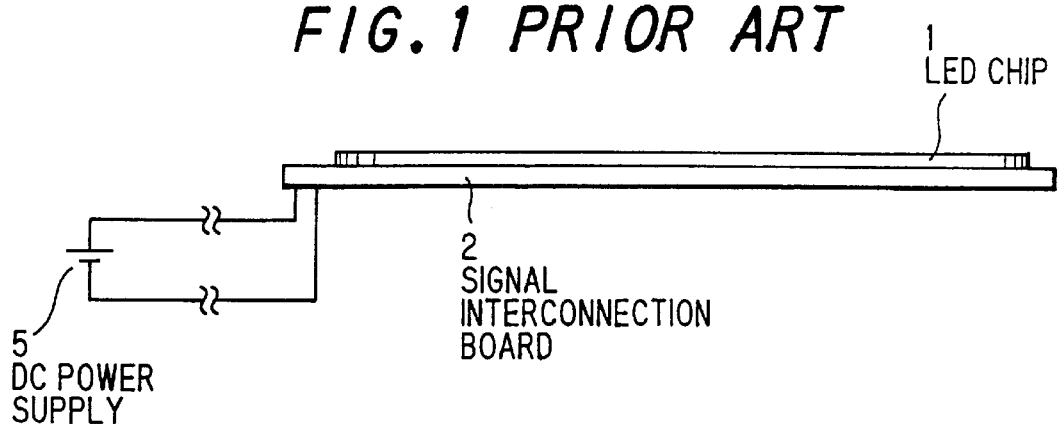
FIG. 1 is a side view showing a conventional LED array.
Figure 2:
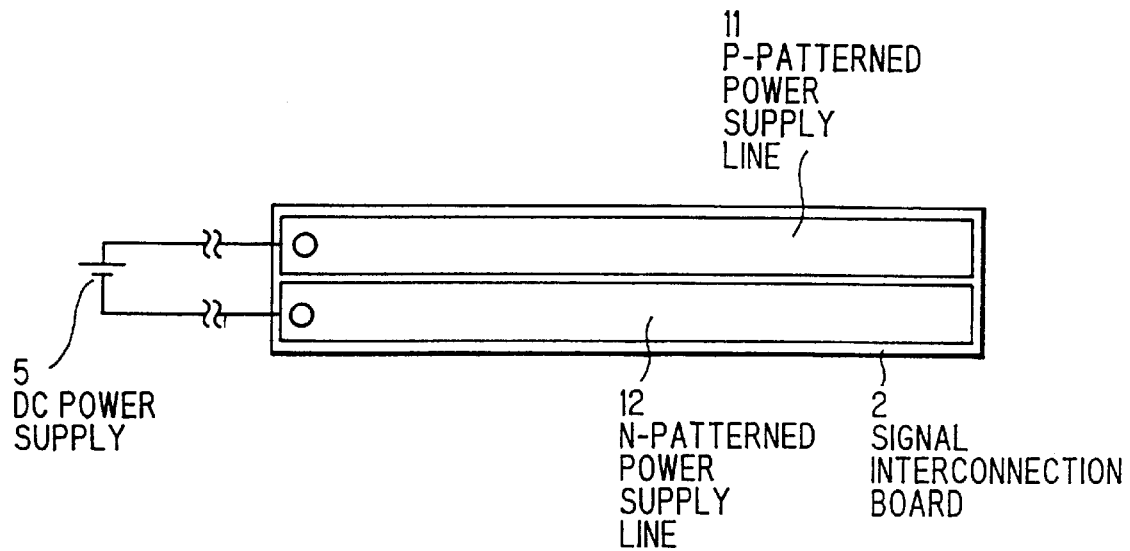
FIG. 2 is a bottom view showing the conventional LED array.
Figure 3:
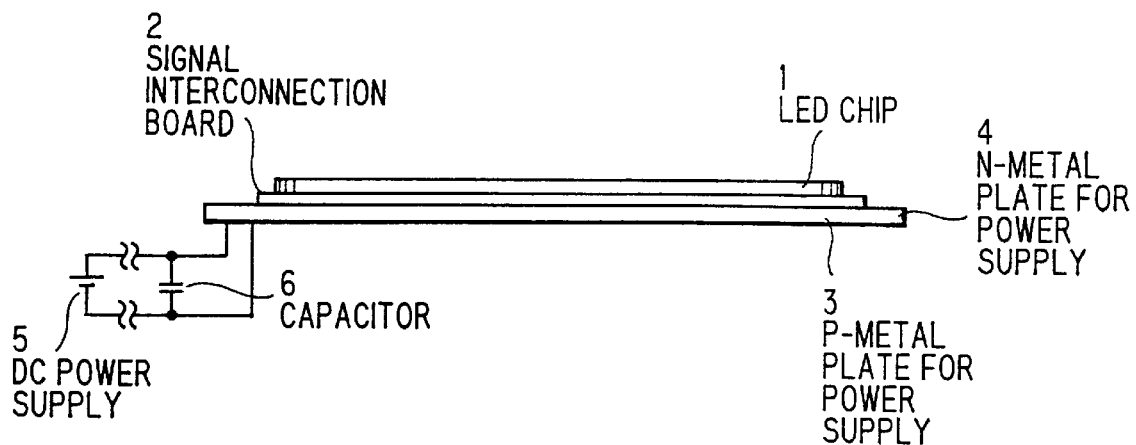
FIG. 3 is a side view showing an embodiment of the LED array according to the present invention.
Figure 4:
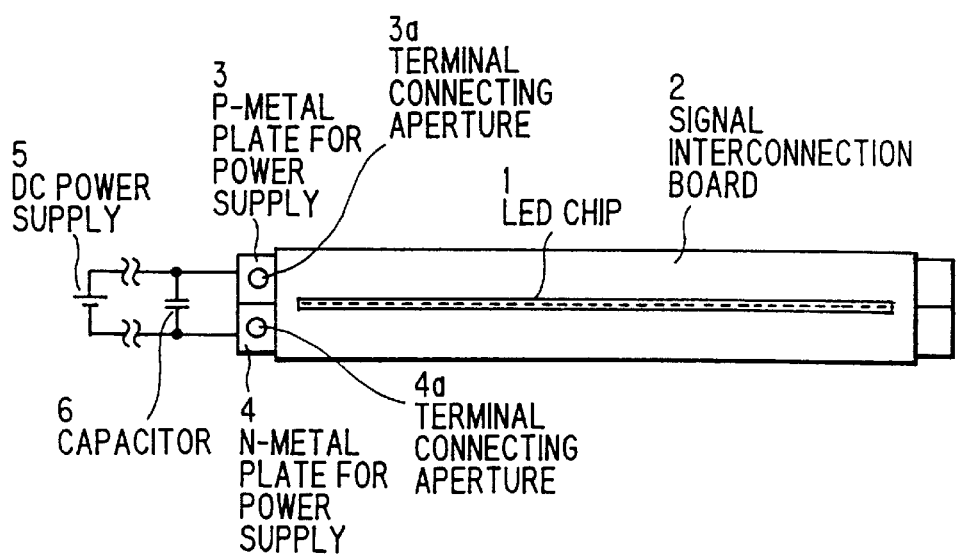
FIG. 4 is a bottom view showing the LED array of FIG. 3.
Figure 5:
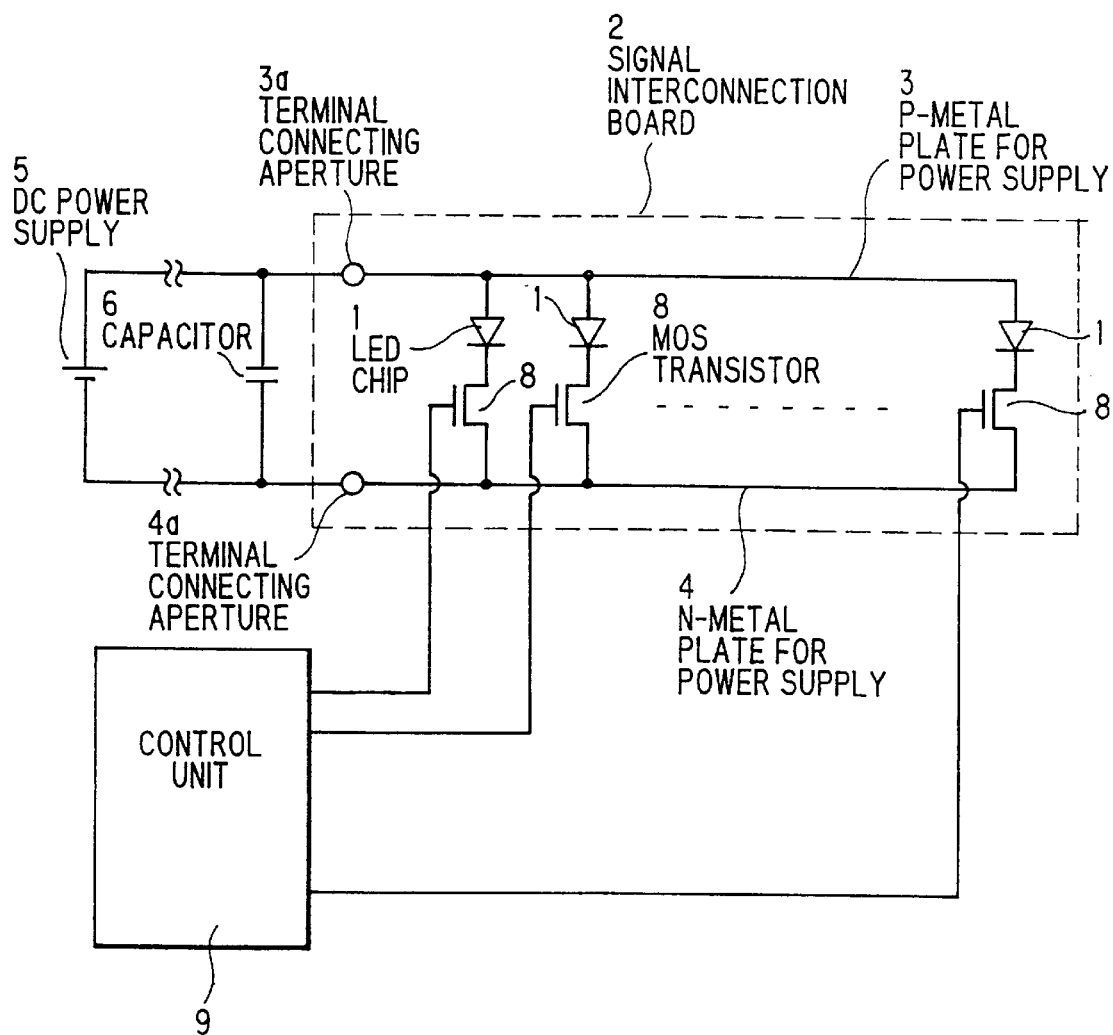
FIG. 5 is a circuit diagram of the LED array shown in FIG. 3.

A side of the LED array according to the invention is shown in FIG. 3, and the bottom of which is shown in FIG. 4. Further, a circuit diagram for the LED array is shown in FIG. 5. In these figures, components common to those in the figures are designated by the same reference numerals, respectively.

As shown in the figures, the LED array of the invention is constituted in such that an LED chip 1 is mounted on the top of a signal interconnection board 2, metal plates 3 and 4 are disposed along the bottom of the signal interconnection board 2 as positive and negative power source lines for driving the LED separately from a pattern of a substrate, and a capacitor 6 is provided between the metal plate 3 being a power source line on the positive (+) side and the metal plate 4 being a power source line on the negative (−) side. Each of the metal plates 3 and 4 covers substantially a half section of the signal interconnection board 2 in its breadth direction, and each of the metal plates projects from both ends of the signal interconnection board 2 in the longitudinal direction thereof, and each terminal for interconnection is provided on the projected extra portion.

The metal plates 3 and 4 are connected to an external DC power supply 5 through metal interconnections, respectively. As shown in FIGS. 3 and 4, the capacitor 6 is positioned in the vicinity of the metal plates 3 and 4 on the way from these metal plates to the DC power supply. Moreover, as shown in FIG. 5, the capacitor 6 is positioned in the vicinity of terminal connecting apertures 3a and 4a for connecting the interconnections extending from the metal plates 3 and 4 to the DC power supply 5. As described herein, it is preferable to position the capacitor 6 in the vicinity of a place where the metal plates 3 and 4 are connected to the interconnections toward the DC power supply as much as possible.

The LED chip 1 is the one wherein a MOS transistor 8 for turning on and off an LED is provided to each LED 1. An anode of each LED a is connected to the positive metal plate 3 for power supply, while a cathode of each LED 1 is connected to a terminal on the load side of each MOS transistor 8, and a terminal on the ground side of each MOS transistor 8 is connected to the negative metal plate 4 for power supply.

Figure 6:
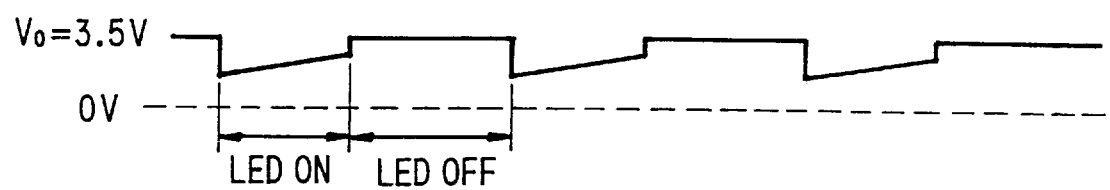
FIG. 6 is a waveform diagram showing a power supply voltage for driving LEDs in a conventional LED array.
Figure 7:
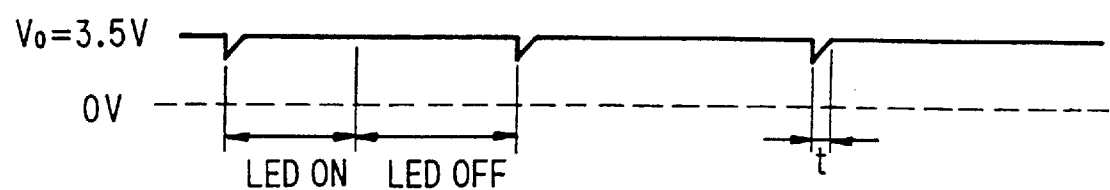
FIG. 7 is a waveform diagram showing a power supply voltage for driving LEDs in an LED array according to the present invention.

In operation, a procedure of turning simultaneously all of LEDs 1 on for a predetermined period of time, and then, turning simultaneously all the LEDs 1 off for a predetermined period of time is repeated under the condition where a power supply voltage VO for driving the LEDs at an ordinary state is 3.5 V. In this case, the power supply voltage for driving the LEDs exhibits behavior of lowering itself at the moment when all the LEDs 1 are simultaneously turned on as shown in FIG. 7. However, since the electric charge stored in the capacitor is discharged, the voltage is restored to its initial state. As a result, the LEDs 1 can obtain a normal voltage during substantially the whole turn-on period of time. In order to compare such action with that of a prior art, when the above described turn-on and turn-off operations are repeated in a conventional LED array, a power supply voltage for driving the LEDs lowers drastically at the moment when all the LEDs are turned simultaneously on, thereafter, the voltage is hardly restored to its initial state, and at last, a normal power supply voltage for driving the LEDs cannot be obtained until a turn-on period of time is finished as shown in FIG. 6. Thus, it is understood that the remarkable voltage fluctuations as shown in FIG. 6 are significantly improved by the present invention as shown in FIG. 7.

When specific numerical values as indicated hereinafter substitute for the following equation:

$$C \geq (K \times I)(VO \times t)$$

a capacitance C of the capacitor 6 was determined as C_3000 $\mu$F wherein a power supply voltage for driving LEDs at an ordinary state is 3.5 V, a total current I at the time of turning all the LEDs on is 25 A, a period of time t in which a voltage lowered instantly at a time of turning the LEDs on is restored to be the voltage VD is 2.5 $\mu$s, and a constant x is 1.05×10−8. As a result, C=3000 $\mu$F in the present embodiment. When a capacitor having a capacitance of 3000 $\mu$F is used as the capacitor 6, the results observed of a power supply voltage for driving the LEDs are as shown in FIG. 7. As described above, a capacitance of the capacitor can be calculated dependent upon a desired period of time for restoring voltage drop by employing a rated voltage and current as well as a fixed constant, so that a capacitance of the capacitor in the case where a high-speed operation is required can easily be also determined.

In the following, another embodiment will be described.

Figure 8:
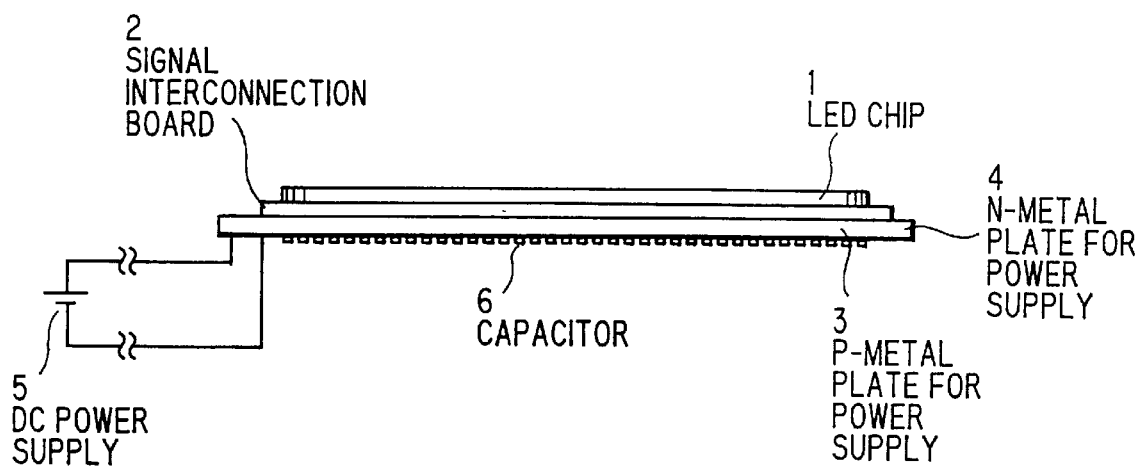
FIG. 8 is a side view showing the LED array according to another embodiment of the present invention.
Figure 9:
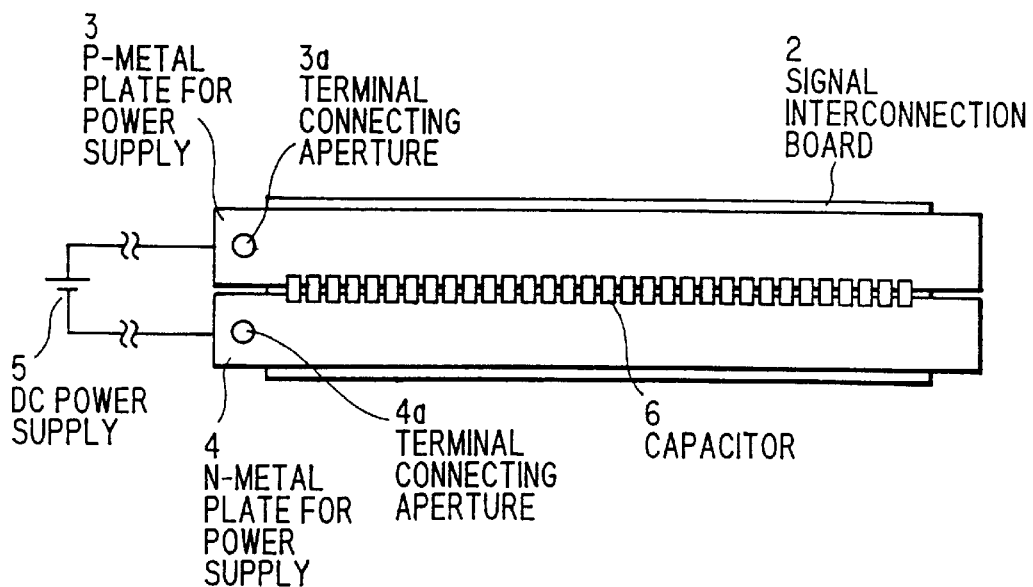
FIG. 9 is a bottom view showing the LED array of FIG. 8.

While one capacitor having a high capacitance has been used in the above described embodiment, a plurality of capacitors each having a low capacitance may be employed. For instance, the same effects as in the above described embodiment can be obtained in the case where a number of capacitors 6 are provided between metal plates 3 and 4 for power supply disposed on the bottom of a signal interconnection board 2 as shown in FIGS. 8 and 9.

Although the invention has been described in only the case where all of LEDs are turned on simultaneously, the present invention is also effective for the case where LEDs are partly turned on as a matter of course.

As described above, since metal plates have been provided separately from patterned interconnections as power supply lines for driving LEDs in the present invention, voltage drop due to a large current is suppressed as a result of lowering impedance of the power supply lines. Besides, since a capacitor is provided between a positive metal plate for power supply and a negative metal plate for power supply, a rapid voltage drop is moderated, and the voltage can be promptly restored. Accordingly, even if all of LEDs are simultaneously turned on by means of a high output, there are no lowering of light output; and no occurrence of variations therein so that an operation for switching turn-on to turn-off and vice versa at high speed becomes also possible. Thus, when the LED array of the invention is applied to an optical printer head and the like, high-speed printing becomes possible while maintaining even and high print quality.

According to the present invention, the following excellent advantages can be obtained.

(1) Since fluctuations in a power supply voltage for driving LEDs are suppressed, variations in light output among the LEDs can be canceled.

(2) It becomes possible to turn simultaneously all the LEDs on, whereby high-speed operation comes to be possible.

It will be appreciated by those of ordinary skill in the art that the present invention can be embodied in other specific forms without departing from the spirit or essential characteristics thereof.

The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. An LED array comprising:

a signal interconnection board having signal interconnections;

a plurality of LEDs each connected to corresponding terminals of said signal interconnections of said signal interconnection board, said plurality of LEDs being arranged in array on a first plane of said signal interconnection boards;

positive and negative power supply metal plates connected to a power supply at first ends thereof and to said signal interconnections of signal interconnection board at second ends thereof, said positive and negative power supply metal plates being arranged on a second plane of said signal connection board; and at least one capacitor provided between said positive and negative power supply metal plates, said at least one capacitor has a capacitance C meeting equation:

$$C \geq (K+I)(VO \times t)$$

where VO is a power supply voltage for driving said plurality of LEDs at an ordinary state, I is total current at the time of turning said plurality of LEDs on, t is a period of time in which voltage lowered instantly at a time of turning said plurality of LEDs on is restored to be the voltage VO, and K is a constant.

2. The LED array as defined in claim 1, wherein:
said at least one capacitor is a capacitor provided between power source lines connecting said first ends of said positive and negative power supply metal to said power supply.

3. The LED array as defined in claim 1, wherein:
said at least one capacitor comprises a plurality of capacitors arranged with a predetermined interval between said positive and negative power supply metal plate on said second plane of said signal interconnection board.

4. The LED array as defined in claim 1, wherein:
each of said plurality of LEDs is connected to a source drain path of a MOS transistor, a gate of said MOS transistor being connected to a control unit.

* * * * *